(12) United States Patent
Hwang

(10) Patent No.: US 7,999,292 B2
(45) Date of Patent: Aug. 16, 2011

(54) IMAGE SENSOR AND MANUFACTURING METHOD THEREOF

(75) Inventor: Joon Hwang, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 457 days.

(21) Appl. No.: 12/204,848

(22) Filed: Sep. 5, 2008

(65) Prior Publication Data

US 2009/0065824 A1 Mar. 12, 2009

(30) Foreign Application Priority Data

Sep. 7, 2007 (KR) .................. 10-2007-0090750
Jun. 20, 2008 (KR) .................. 10-2008-0058120

(51) Int. Cl.
*H01L 31/062* (2006.01)

(52) U.S. Cl. . 257/292; 257/222; 257/294; 257/E27.133; 257/E31.079

(58) Field of Classification Search .................. 257/222, 257/292, 294, E27.133, E31.079
See application file for complete search history.

(56) References Cited

U.S. PATENT DOCUMENTS

| | | | | |
|---|---|---|---|---|
| 6,927,432 B2 * | 8/2005 | Holm et al. | .................. | 257/290 |
| 2006/0001121 A1 | 1/2006 | Jeon | | |
| 2006/0181629 A1 * | 8/2006 | Miyashita et al. | ............ | 348/311 |
| 2007/0018266 A1 | 1/2007 | Dupont et al. | | |
| 2008/0079102 A1 * | 4/2008 | Chen et al. | .................... | 257/431 |
| 2008/0093695 A1 * | 4/2008 | Gao et al. | ...................... | 257/428 |

OTHER PUBLICATIONS

Office Action dated Jun. 9, 2011 in German Application No. 2008-046036, filed Sep. 5, 2008.

* cited by examiner

*Primary Examiner* — N Drew Richards
*Assistant Examiner* — Yu-Hsi Sun
(74) *Attorney, Agent, or Firm* — Saliwanchik, Lloyd & Eisenschenk

(57) ABSTRACT

An image sensor can be formed of a first substrate having a readout circuitry, an interlayer dielectric, and lower lines, and a second substrate having a photodiode. The first substrate comprises a pixel portion and a peripheral portion. The readout circuitry is formed on the pixel portion. The interlayer dielectric is formed on the pixel portion and the peripheral portion. The lower lines pass through the interlayer dielectric to electrically connect with the readout circuitry and the peripheral portion. The photodiode is bonded to the first substrate and etched to correspond to the pixel portion. A transparent electrode is formed on the interlayer dielectric on which the photodiode is formed such that the transparent electrode can be connected with the photodiode and the lower line in the peripheral portion. A first passivation layer can be formed on the transparent electrode. In one embodiment, the first passivation layer includes a trench exposing a portion of the transparent electrode. Then, an upper line can be formed on the peripheral portion and in the trench to shield a lateral side of the photodiode.

18 Claims, 11 Drawing Sheets

IMAGE SENSOR AND MANUFACTURING METHOD THEREOF

CROSS-REFERENCE TO RELATED APPLICATIONS

The present application claims the benefit under 35 U.S.C. §119 to Korean Patent Application No. 10-2007-0090750, filed Sep. 7, 2007, and Korean Patent Application No. 10-2008-0058120, filed Jun. 20, 2008, which are hereby incorporated by reference in their entirety.

BACKGROUND

An image sensor is a semiconductor device for converting an optical image into an electrical signal. The image sensor is roughly classified as a charge coupled device (CCD) image sensor or a complementary metal oxide semiconductor (CMOS) image sensor (CIS).

In an image sensor, a photodiode is typically formed in a substrate with readout circuitry using ion implantation. As the size of a photodiode reduces more and more for the purpose of increasing the number of pixels without an increase in a chip size, the area of a light receiving portion reduces, so that an image quality reduces.

Also, since a stack height does not reduce as much as the reduction in the area of the light receiving portion, the number of photons incident to the light receiving portion also reduces due to diffraction of light, called airy disk.

As an alternative to overcome this limitation, an attempt of forming a photodiode using amorphous silicon (Si), or forming a readout circuitry in a Si substrate and forming a photodiode on the readout circuitry using a method such as wafer-to-wafer bonding has been made (referred to as a "three-dimensional (3D) image sensor). The photodiode is connected with the readout circuitry through a metal line.

However, for a 3D image sensor, when the photodiode is formed on the substrate having the readout circuitry, a height difference is generated between the top surface of the photodiode and the top surface of the substrate. Particularly, since the lateral sides of some of the photodiodes formed in the edge region of the chip are exposed, undesired light is incident to the lateral sides and so light sensitivity may reduce.

Meanwhile, according to a related art, when the surface voltage of the photodiode is lowered by incident light, the surface voltage of a voltage sensing portion is also lowered simultaneously. After that, when a transfer transistor Tx is opened and then closed, voltages of the source and the drain of the transfer transistor become equal to each other, and a potential difference of the drain is amplified through a drive transistor. According to the related art, since the both the source and the drain of the transfer transistor are heavily doped with N-type impurities, a charge sharing phenomenon occurs. When the charge sharing phenomenon occurs, the sensitivity of an output image is reduced and an image error may be generated.

Also, according to the related art, because a photo charge does not swiftly move between the photodiode and the readout circuitry, a dark current is generated or saturation and sensitivity are reduced.

BRIEF SUMMARY

Embodiments of the present invention provide an image sensor that can improve light sensitivity of a photodiode by forming an upper line blocking light incident to the lateral side of the photodiode located in the edge region of a pixel portion, and a manufacturing method thereof.

Embodiments also provide an image sensor comprising a transparent electrode on a photodiode and a peripheral portion, the transparent electrode being electrically connected with an upper line to apply a voltage to the photodiode and a peripheral circuitry, and a manufacturing method thereof.

In one embodiment, an image sensor can comprise: a first substrate comprising a pixel portion and a peripheral portion; a readout circuitry on the pixel portion; an interlayer dielectric on the pixel portion and the peripheral portion; lower lines passing through the interlayer dielectric to respectively electrically connect with the readout circuitry and the peripheral portion; a photodiode on a portion of the interlayer dielectric corresponding to the pixel portion; a transparent electrode on the interlayer dielectric including the photodiode, the transparent electrode being connected with the photodiode and the lower line in the peripheral portion; a first passivation layer on the transparent electrode, the first passivation layer comprising a trench exposing a portion of the transparent electrode corresponding to the lower line in the peripheral portion; and an upper line on the peripheral portion including in the trench, the upper line having the same surface height as a top surface of the first passivation layer in the pixel portion.

In another embodiment, the transparent electrode can be formed on only the pixel portion, and the first passivation layer can be formed on the transparent electrode and the interlayer dielectric of the peripheral portion. The passivation layer can include a trench exposing the lower line in the peripheral portion and another trench exposing the transparent electrode at an edge region of the pixel portion. The upper line can be formed in the trenches, connecting the transparent electrode to the lower line and shielding the lateral side of the photodiode.

According to one embodiment, a method for manufacturing an image sensor can comprise: preparing a first substrate where a pixel portion and a peripheral portion are defined; forming a readout circuitry on the pixel portion; forming an interlayer dielectric on the first substrate comprising the pixel portion and the peripheral portion; forming lower lines connected with the readout circuitry and the peripheral portion in the interlayer dielectric; preparing a second substrate comprising a crystalline semiconductor layer; forming a photodiode in the crystalline semiconductor layer; bonding the first substrate and the second substrate such that the lower line of the first substrate is electrically connected with the photodiode; separating the second substrate to expose the photodiode; removing a portion of the photodiode corresponding to the peripheral portion such that the photodiode remains only on the pixel portion and exposes the lower line in the peripheral portion; forming a transparent electrode layer on the interlayer dielectric on which the photodiode is formed so that the transparent electrode layer is connected with the photodiode and the lower line in the peripheral portion; forming a first passivation layer on the transparent electrode layer; forming a trench exposing the transparent electrode layer in a portion of the first passivation layer corresponding to the lower line in the peripheral portion; and forming an upper line on the peripheral portion, including in the trench.

According to another embodiment, the method can include forming the transparent electrode layer on the photodiode; forming a first passivation layer on the transparent electrode layer and the interlayer dielectric of the peripheral portion; forming a first trench in the first passivation layer exposing the transparent electrode layer at an edge region of the pixel portion and a second trench in the first passivation layer exposing the lower line in the peripheral portion; and forming an upper line in the first trench and second trench and along a lateral side of the photodiode, the upper line connecting the transparent electrode to the lower line in the peripheral portion.

The details of one or more embodiments are set forth in the accompanying drawings and the description below. Other features will be apparent from the description and drawings, and from the claims.

DETAILED DESCRIPTION

Embodiments of an image sensor and a manufacturing method thereof will be described in detail with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 10:
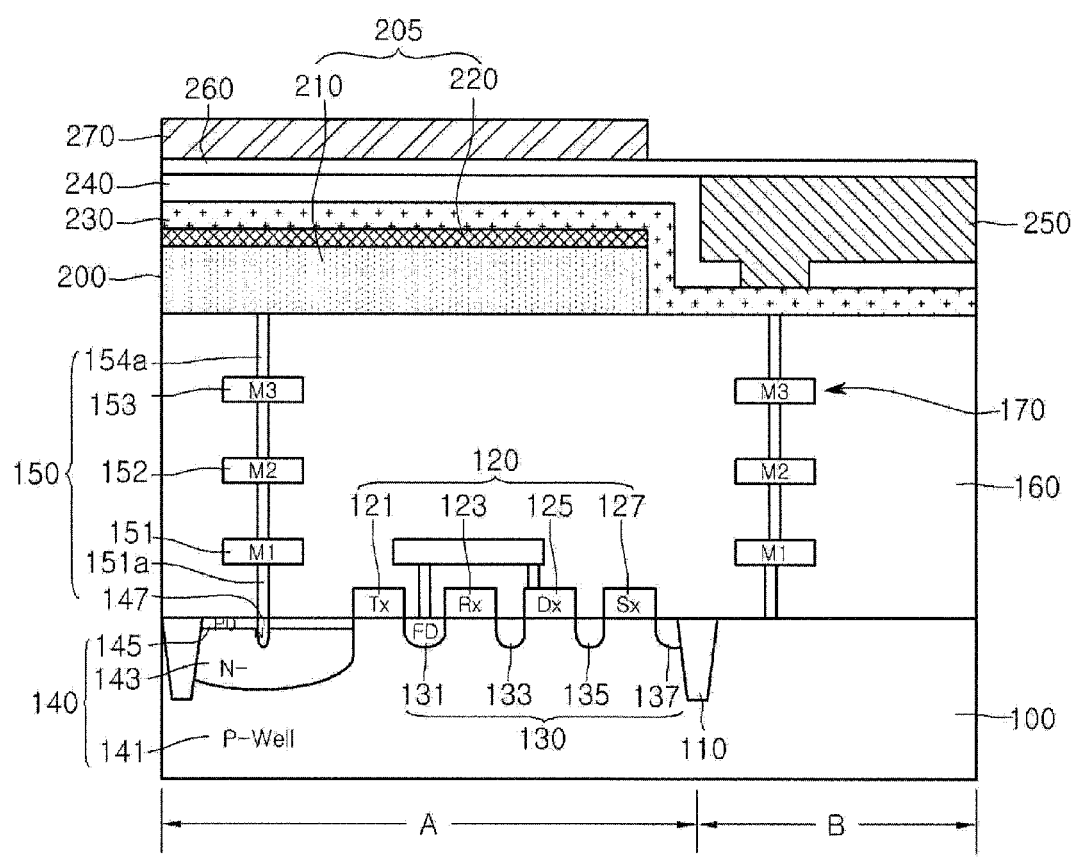

FIG. 10 is a cross-sectional view of an image sensor according to an embodiment.

Referring to FIG. 10, an image sensor can include: a first substrate 100 including a pixel portion A and a peripheral portion B; a readout circuitry 120 on the pixel portion A; an interlayer dielectric 160 on the first substrate 100 including the pixel portion A and the peripheral portion B; lower lines 150 and 170 passing through the interlayer dielectric 160 to electrically connect with the readout circuitry 120 and the peripheral portion B, respectively; a photodiode 205 on a portion of the interlayer dielectric 160 corresponding to the pixel portion A; a transparent electrode 230 on the interlayer dielectric 160 on which the photodiode 205 is formed, the transparent electrode 230 being connected with the photodiode 205 and the lower line 170 in the peripheral portion B; a first passivation layer 240 on the transparent electrode 230, the first passivation layer 240 including a trench 241 exposing a portion of the transparent electrode 230 corresponding to the lower line 170 in the peripheral portion B; and an upper line 250 in the trench 241, the upper line 250 having the same surface height as the first passivation layer 240 on the pixel portion A.

The readout circuitry 120 of the first substrate 100 can include an electrical junction region 140 formed in the first substrate 100; and a first conduction type connection region 147 connected with the line 150 on the electrical junction region 140.

The upper line 250 can be disposed in the trench 241 of the first passivation layer 240 to electrically connect with the transparent electrode 230. Also, the upper line 250 can be formed to the same height as the first passivation layer 240 formed on the photodiode 205. By forming the upper line to a height above the photodiode 205, the upper line 250 can block light incident to the lateral side of the photodiode 205 to improve an image characteristic.

Figure 12:
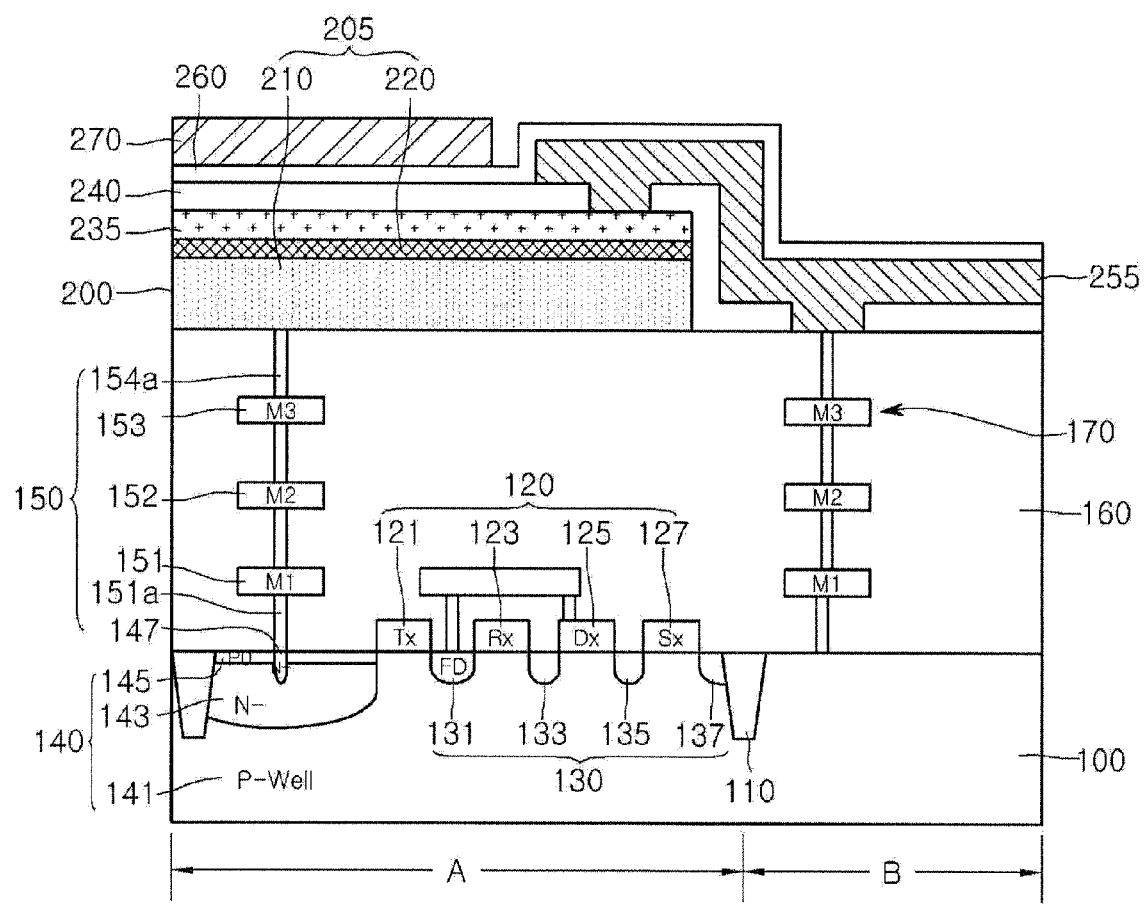

FIG. 12 is a cross-sectional view of an image sensor according to another embodiment where the transparent electrode is formed on only the photodiode.

Referring to FIG. 12, a transparent electrode 235 is disposed on only the photodiode 205 on the first substrate 100 to electrically connect with the photodiode 205. The first passivation layer 240, having a first trench 243 and a second trench 245, is disposed on the interlayer dielectric 160 on which the transparent electrode 235 is formed. The first and second trenches 243 and 245 expose the transparent electrode 235 and the lower line 170, respectively.

An upper line 255 is disposed on the first passivation layer 240 including the first and second trenches 243 and 245. The upper line 255 can be formed in such a way that it does not screen the photodiode 205 corresponding to a unit pixel. The upper line 255 is disposed inside the first and second trenches 243 and 245 to connect the transparent electrode 235 to the lower line 170.

Also, the upper line 255 extends from the first trench 243 to the second trench 245 to screen the lateral side of the photodiode 205. Therefore, the upper line 255 can block light incident to the lateral side of the photodiode 205.

According to embodiments, the photodiode can be formed in a crystalline semiconductor layer. Since the photodiode is formed inside a crystalline semiconductor layer, a defect of the photodiode can be inhibited.

Also, the upper line, which can be used for applying a ground voltage to the photodiode, is formed to screen the lateral side of the photodiode, and thus serve as a light blocking layer. Therefore, light sensitivity of the photodiode can be improved.

According to embodiments of the present invention, a device is designed such that a potential difference is generated between a source and drain of a transfer transistor Tx, so that a photo charge from the photodiode 205 can be fully dumped. Accordingly, since a photo charge generated from the photodiode 205 is fully dumped to a floating diffusion region, the sensitivity of an output image can be increased.

That is, an electrical junction region 140 can be formed in the first substrate 100 where the readout circuitry 120 is formed to allow a potential difference to be generated between the source and the drain of the transfer transistor Tx 121, so that a photo charge can be fully dumped. The readout circuitry 120 can include a transfer transistor Tx 121, a reset transistor Rx 123, a drive transistor Dx 125, and a select transistor Sx 127.

Hereinafter, a dumping structure of a photo charge according to an embodiment is described in detail.

The electrical junction region 140 can include a first conduction type ion implantation layer 143 formed on a second conduction type well 141 (or a second conduction type epitaxial layer (not shown)), and a second conduction type ion implantation layer 145 formed on the first conduction type ion implantation layer 143. For example, the electrical junction region 140 can be, but is not limited to, a PN junction or a PNP junction.

Unlike a node of a floating diffusion FD 131, which is an N+ junction, the PNP junction 140 to which an applied voltage is not fully transferred is pinched-off at a predetermined voltage. This voltage is called a pinning voltage, which depends on the doping concentrations of a P0 region 145 and an N− region 143.

Specifically, an electron generated from the photodiode 205 moves to the PNP junction 140, and is transferred to the node of the floating diffusion FD 131 and converted into a voltage when the transfer transistor Tx 121 is turned on.

Since a maximum voltage value of the P0/N−/P− junction 140 becomes a pinning voltage, and a maximum voltage value of the node of the floating diffusion FD 131 becomes a threshold voltage Vth of a Vdd-Rx 123, an electron generated from the photodiode 205 in the upper portion of a chip can be fully dumped to the node of the floating diffusion FD 131 without charge sharing by implementing a potential difference between the sides of the transfer transistor Tx 131.

That is, according to an embodiment, the P0/N−/P-well junction, not an N+/P-well junction, is formed in the first substrate to allow a + voltage to be applied to the N− region 143 of the P0/N−/P-well junction and a ground voltage to be applied to the P0 145 and P-well 141 during a 4-Tr active pixel sensor (APS) reset operation, so that a pinch-off is generated at the P0/N−/P-well double junction at a predetermined voltage or more as in a bipolar junction transistor (BJT) structure. This is called the pinning voltage. Therefore, a potential difference is generated between the source and the drain at the sides of the transfer transistor Tx 121, which inhibits a charge sharing phenomenon during the on/off operations of the transfer transistor Tx.

Therefore, unlike a case where a photodiode is simply connected with an N+ junction (N+/P-well) as in a related art, limitations such as saturation reduction and sensitivity reduction can be avoided.

Also, according to an embodiment, the first conduction type connection region 147 is formed between the photodiode and the readout circuitry to provide a swift movement path of a photo charge, so that a dark current source is minimized, and saturation reduction and sensitivity reduction can be inhibited.

For this purpose, the first conduction type connection region 147 for ohmic contact can be formed on the surface of the P0/N−/P− junction 140 according to an embodiment. Meanwhile, to inhibit the first conduction type connection region 147 from becoming a leakage source, the width of the first conduction type connection region 147 can be minimized. By doing so, a dark current of the 3D image sensor can be reduced.

That is a reason for locally and heavily doping only a contact forming portion with N type impurities in the above described embodiment is to facilitate ohmic contact formation while minimizing a dark signal. In case of heavily doping the entire transfer transistor (Tx source), a dark signal may be increased by a silicon (Si) surface dangling bond.

A method for manufacturing an image sensor according to an embodiment is described with reference to FIGS. 1 to 12.

Figure 1:
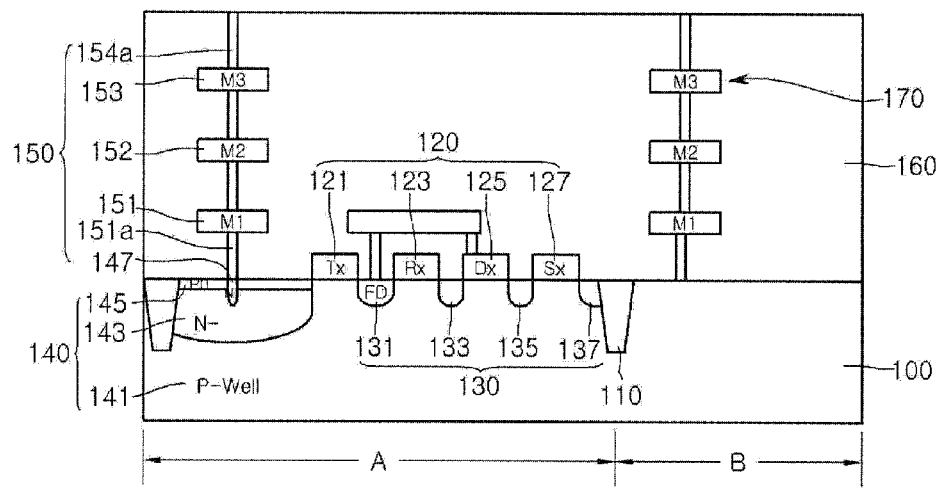
FIGS. 1 to 12 are cross-sectional views illustrating a process of manufacturing an image sensor according to an embodiment.

Referring to FIG. 1, readout circuitry 120 can be formed on the pixel portion A of the first substrate 100. A device isolation layer 110 defining an active region and a field region can be formed in the first substrate 100. The pixel portion A where a unit pixel is formed and the peripheral portion B for signal processing are formed in the active region of the first substrate 100. For example, in one embodiment, the readout circuitry 120 can include a transfer transistor Tx 121, a reset transistor Rx 123, a drive transistor Dx 125, and a select transistor Sx 127. The floating diffusion region FD 131 and ion implantation regions 130 including source/drain regions of the respective transistors can be formed. The transistor circuitry (not shown) of the peripheral portion B can be simultaneously formed while the readout circuitry 120 is formed.

The forming of the readout circuitry 120 on the first substrate 100 can include forming an electrical junction region 140 in the first substrate 100 and forming a first conduction type connection region 147 connected with the lower line 150 on the electrical junction region 140.

The electrical junction region 140 can be, but is not limited to, a PN junction 140. For example, the electrical junction region 140 can include a first conduction type ion implantation layer 143 formed on a second conduction type well 141 (or a second conduction type epitaxial layer), and a second conduction type ion implantation layer 145 formed on a first conduction type ion implantation layer 143. For example, the PN junction 140 can be the P0 (145)/N− (143)/P− (141) junction such as shown in FIG. 1. In an embodiment, the first substrate 100 can be a second conduction type substrate.

According to an embodiment, the electrical junction region 140 can be formed in the first substrate 100 where the readout circuitry 120 is formed to allow a potential difference to be generated between the source and the drain of the transfer transistor Tx 121, so that a photo charge can be fully dumped.

That is, according to the embodiment, a device is designed such that there is a potential difference between the source and drain of the transfer transistor Tx, so that a photo charge can be fully dumped. For example, a device can be designed such that a potential difference is generated between the source and drain of the transfer transistor Tx by making the doping concentration of the N-region 143 lower than the doping concentration of the floating diffusion region FD 131.

Next, according to one embodiment, the first conduction type connection region 147 for ohmic contact can be formed on the surface of the P0/N−/P− junction 140. For example, an N+ region 147 for ohmic contact can be formed on the surface of the P0/N−/P− junction 140. According to an embodiment, the N+ region 147 can be formed to pass through the P0 region 145 and contact the N-region 143.

Meanwhile, to inhibit the first conduction type connection region 147 from becoming a leakage source, the width of the first conduction type connection region 147 can be minimized. For this purpose, a plug implant can be performed after etching a via for a first metal contact 151a. However, embodiments are not limited thereto. For example, in another embodiment, ion implantation patterns (not shown) can be formed and then the first conduction type connection region 147 can be formed using the ion implantation patterns as an ion implantation mask.

According to embodiments, the first conduction type connection region 147 is formed between the photodiode and the readout circuitry 120 to provide a swift movement path of a photo charge, and thus minimize a dark current source and inhibit saturation reduction and sensitivity reduction.

An interlayer dielectric 160 can be formed on the first substrate 100, and then the lower line 150 is formed. The lower line 150 can include but is not limited to the first metal contact 151a, a first metal 151, a second metal 152, a third metal 153, and a fourth metal contact 154a.

The lower line 150 is formed for each unit pixel to connect the photodiode 205 with the readout circuitry 120 and transfer a photo charge of the photodiode 205. While the lower line 150 connected with the readout circuitry 120 is formed, a lower line 170 connected with the peripheral portion B can be simultaneously formed. The lower lines 150 and 170 can be formed of various conductive materials including metal, alloy, and silicide.

Figure 2:
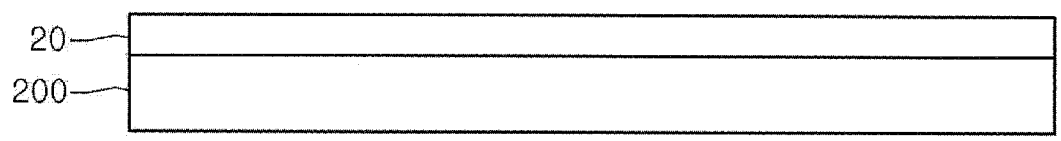

Referring to FIG. 2, a second substrate 20 including a crystalline semiconductor layer 200 can be prepared. The second substrate 20 can be a single crystal or polycrystal silicon substrate, and can be a substrate doped with p-type impurities or n-type impurities. The crystalline semiconductor layer 200 can be formed on the second substrate 20 through, for example, epitaxial growing.

Figure 3:
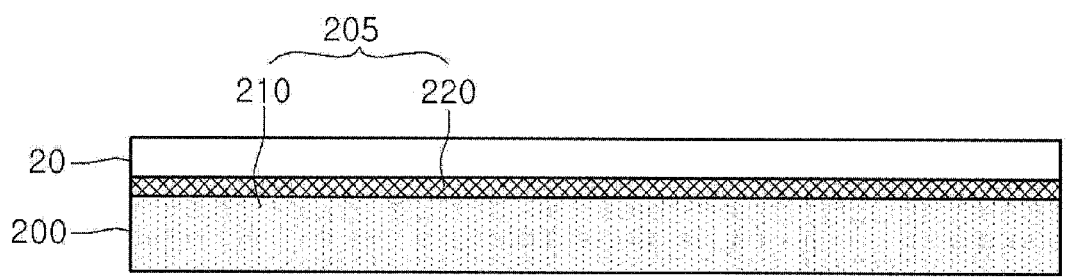

Referring to FIG. 3, the photodiode 205 is formed inside the crystalline semiconductor layer 200. The photodiode 230 can include a first impurity region 210 and a second impurity region 220.

The first impurity region 210 can be formed by implanting n-type impurities into a deep region of the crystalline semiconductor layer 200 (i.e. the region nearest the second substrate 20). The second impurity region 220 can be formed by implanting p-type impurities into a shallow region of the crystalline semiconductor layer 200 (i.e. a region near the surface of the crystalline semiconductor layer 200). Since the first impurity region 210 and the second impurity region 220 are formed to contact each other, the photodiode 205 can have a PN junction structure. Therefore, a photo charge generated from the photodiode 205 can be transferred to the readout circuitry 120 through the lower line 150.

Though not shown, an ohmic contact layer can be formed by implanting high concentration n-type impurities into the surface of the first impurity region 210. Also, a device isolation layer can be formed inside the crystalline semiconductor layer 200 by, for example, implanting p-type impurities to separate photodiodes 205 for respective unit pixels.

Since the photodiodes 205 are formed inside the crystalline semiconductor layer 200 by ion implantation, a defect inside the photodiode 205 can be inhibited and a dark current generation can be reduced.

Figure 4:
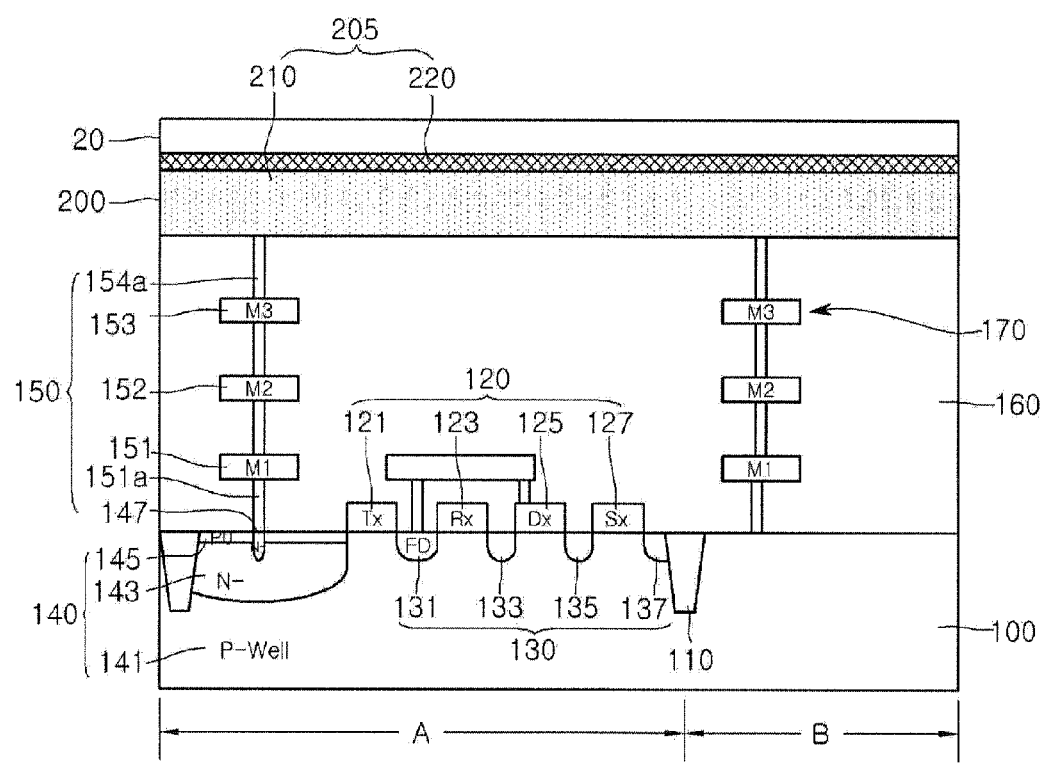

Referring to FIG. 4, the first substrate 100 including the lower lines 150 and 170, and the second substrate 20 including the crystalline semiconductor layer 200 are bonded to each other. When the first substrate 100 and the second substrate 20 are bonded to each other, the fourth metal contact 154a, which is the lower line 150, is electrically connected with the first impurity region 210 of the photodiode 205.

Figure 5:
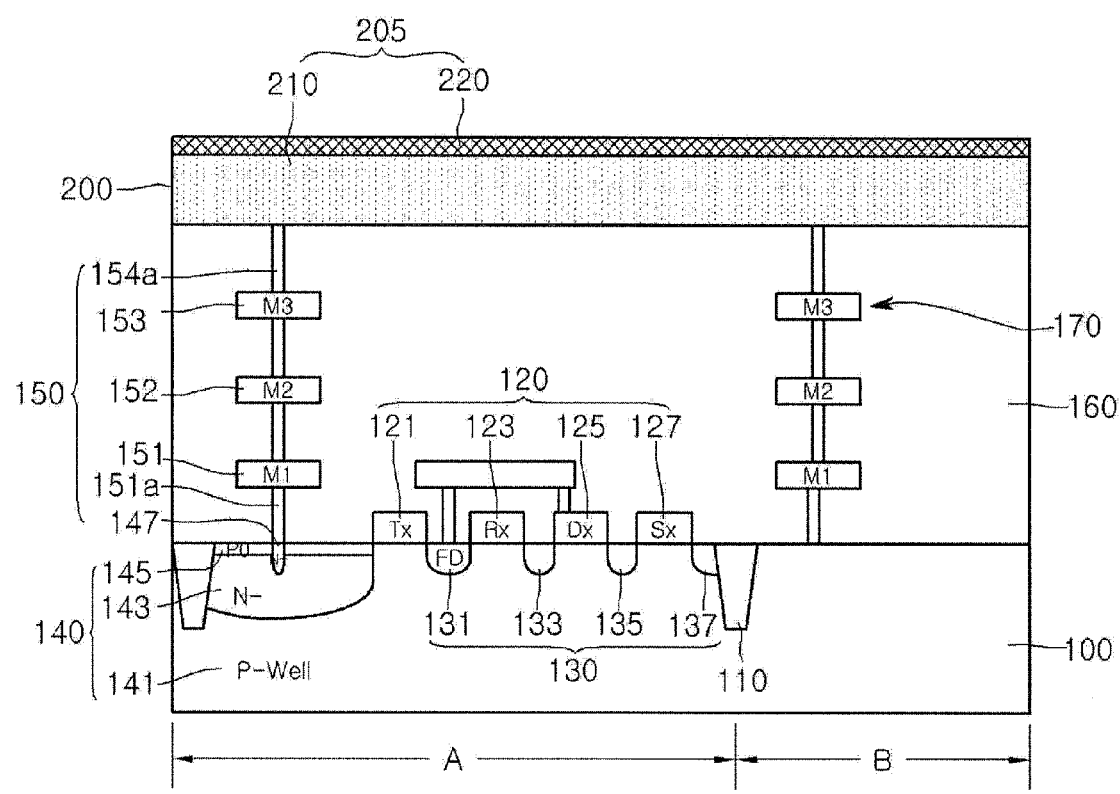

Referring to FIG. 5, the second substrate 20 is removed such that the photodiode 205 remains on the first substrate 100. For example, the second substrate 20 can be removed using a blade, so that the photodiode 205 can be exposed.

Therefore, since the crystalline semiconductor layer 200 including the photodiode 205 remains on the first substrate 100, the first substrate 100 and the photodiode 205 are vertically integrated.

Figure 6:
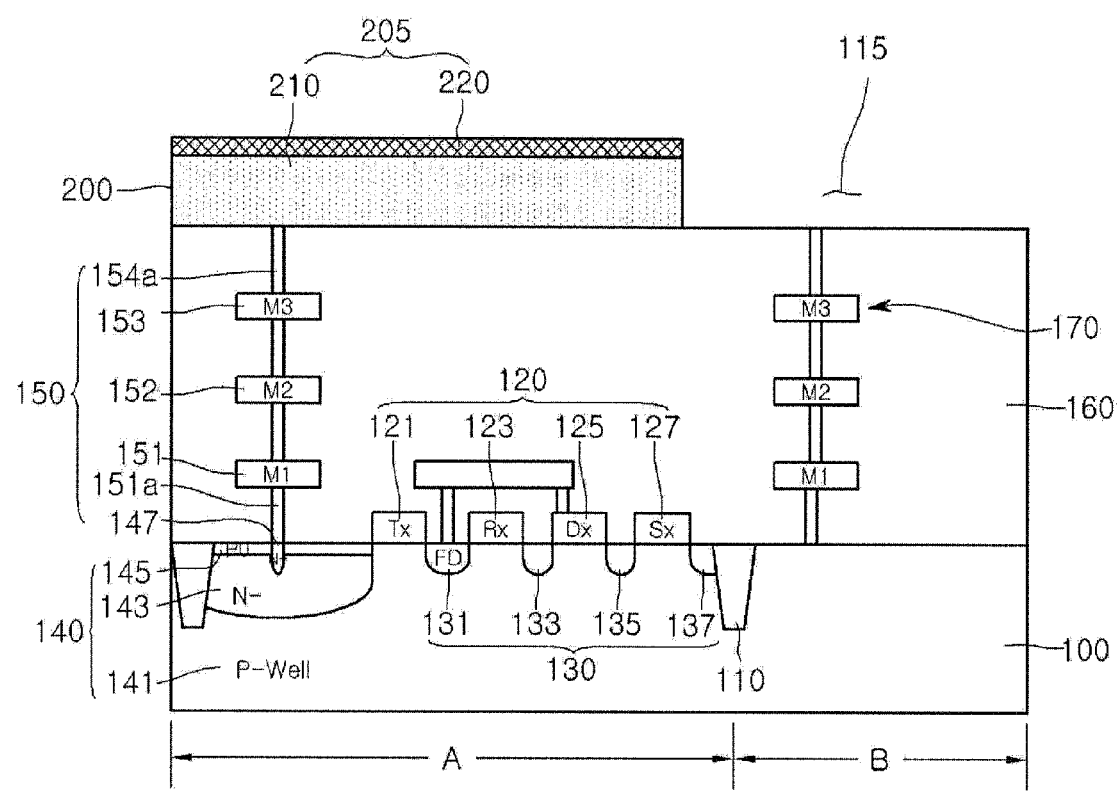

Referring to FIG. 6, a portion of the crystalline semiconductor layer 200 bonded on the first substrate 100 is removed, so that a region 115 exposing a portion of the interlayer dielectric 160 corresponding to the peripheral portion B and a top surface of the lower line 170 is formed. The photodiode 205 can remain on only the pixel portion A after exposing the region 115. Particularly, the photodiode 205 shown in FIG. 6 can be a photodiode 205 for a pixel located at an edge of the pixel portion A of the entire region of the first substrate 100.

The pixel portion A has a height difference with the peripheral portion B due to the height of the photodiode 205. Therefore, the sidewall of the photodiode 205 adjacent to the peripheral portion B is exposed.

Figure 7:
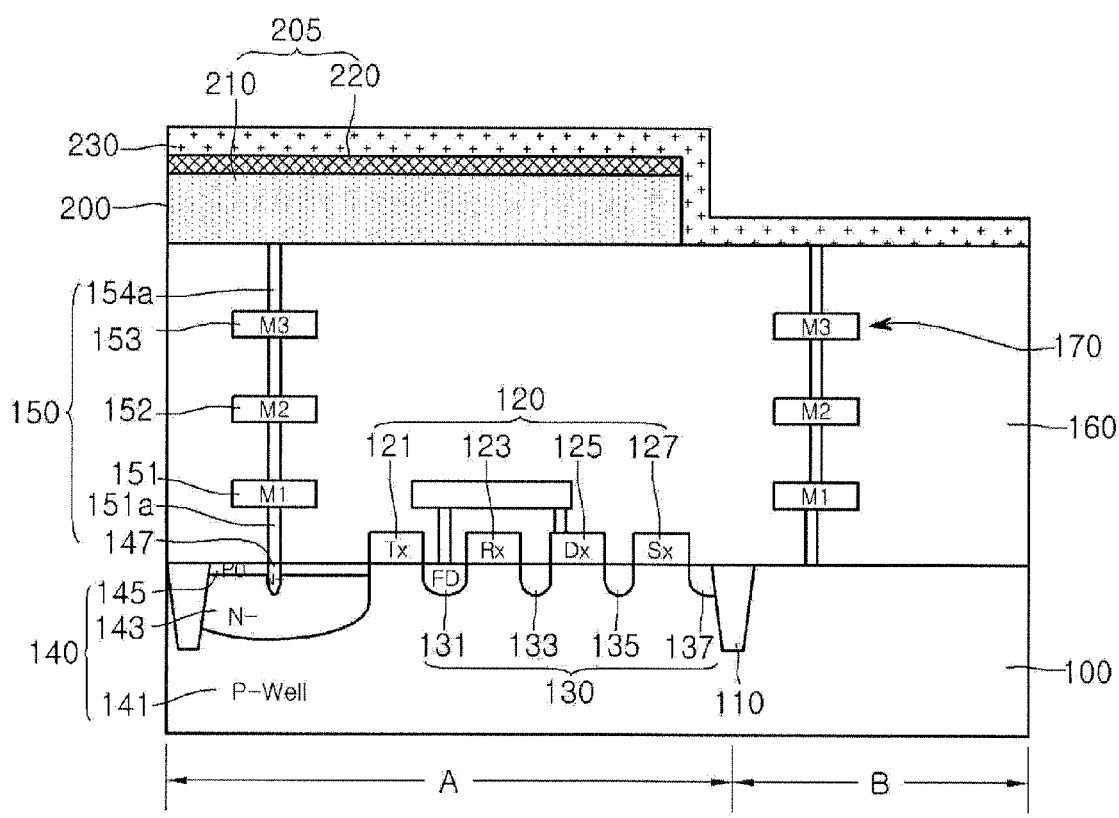

Referring to FIG. 7, a transparent electrode 230 can be formed on the first substrate 100 on which the photodiode 205 is formed. The transparent electrode 230 can be electrically connected with the photodiode 205 and the line 170 in the peripheral portion B. For example, the transparent electrode 230 can be formed of indium tin oxide (ITO), cadmium tin oxide (CTO), or $ZnO_2$.

Figure 8:
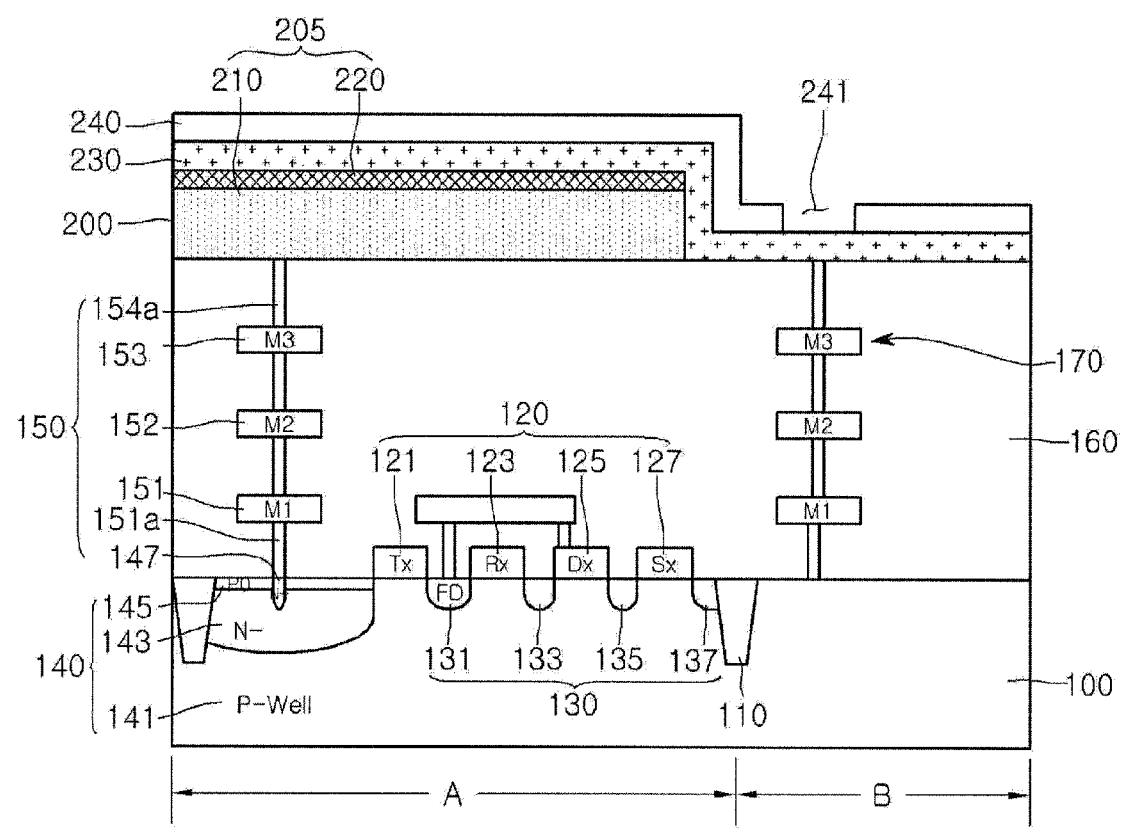

Referring to FIG. 8, a first passivation layer 240 can be formed on the first substrate 100 on which the transparent electrode 230 is formed. The first passivation layer 240 can be, for example, an oxide layer or a nitride layer. A trench 241 can be formed in the first passivation layer 240 by etching the first passivation layer 240 to expose a portion of the transparent electrode 230 on the peripheral portion B.

Figure 9:
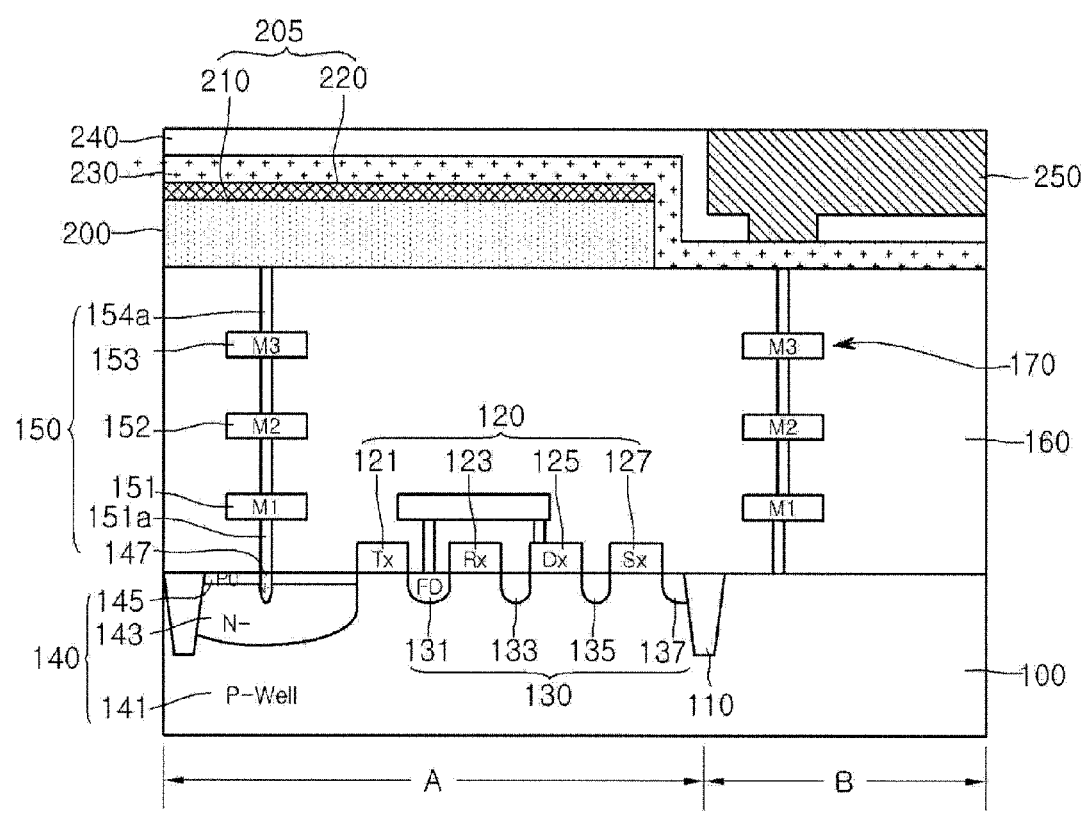

Referring to FIG. 9, an upper line 250 can be formed in the trench 241. The upper line 250 can be formed of a conductive material such as aluminum, copper, titanium and/or tungsten. The upper line 250 is formed on the first passivation layer 240 including the trench 241 to be electrically connected with the transparent electrode 230 and, thus, the lower line 170.

The upper line 250 can have the same height as the top surface of the first passivation layer 240 in the pixel portion A by depositing a metal layer (not shown) and performing a planarization process using the passivation layer 240 as an etch stop. Since a height difference between the pixel portion A and the peripheral portion B is removed due to formation of the upper line 250, a color filter process, which is a subsequent process, can be easily performed.

Since the upper line 250 is selectively formed on a portion of the transparent electrode 230 corresponding to the lower line 170, the upper line 250 does not block light incident a top surface of the photodiode 205 and so the light receiving region of the photodiode 205 can be secured as much as possible.

Referring to FIG. 10, a second passivation layer 260 can be formed on the first passivation layer 240 on which the upper line 250 is formed. Also, a color filter 270 can be formed on a portion of the second passivation layer 260 corresponding to the photodiode 205 in a unit pixel.

Figure 11:
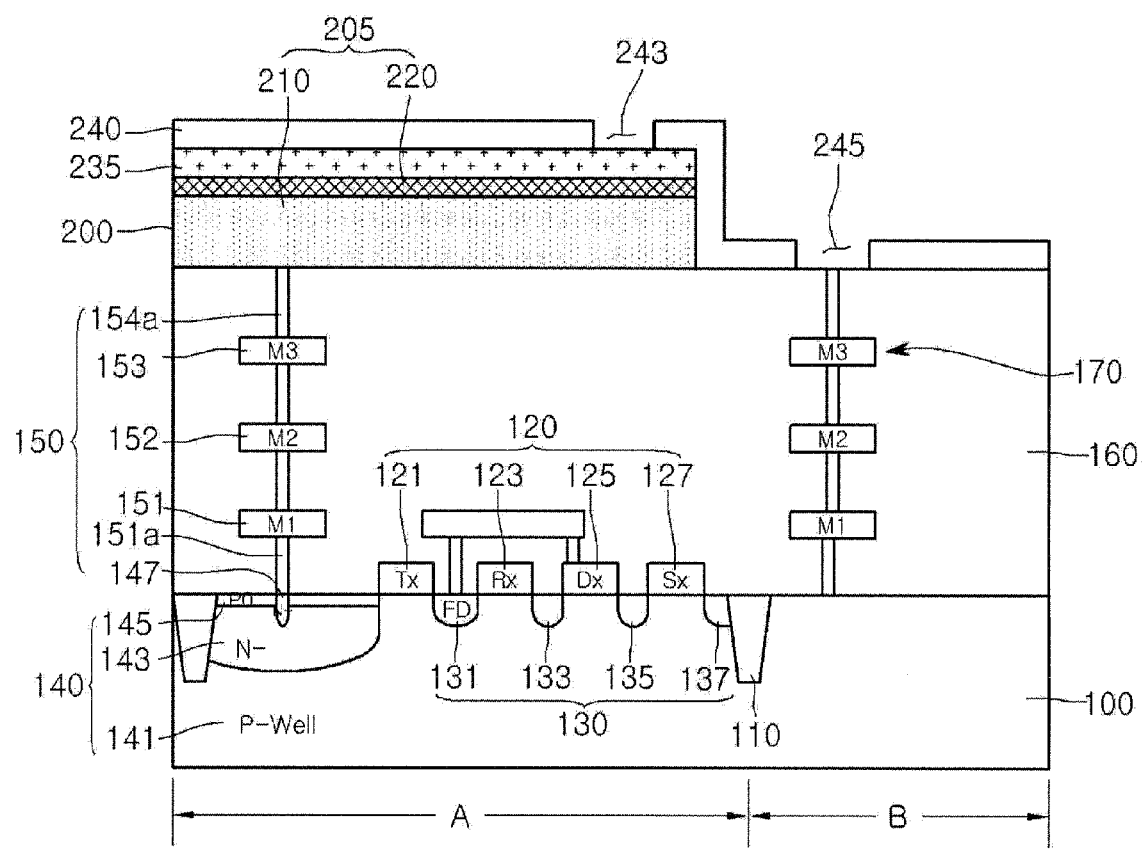

FIGS. 11 and 12 illustrate an embodiment where the transparent electrode is formed on only the pixel portion.

Referring to FIG. 11, a transparent electrode 235 can be formed by forming a transparent electrode layer (not shown) on the first substrate on which the photodiode 205 is formed, and patterning the transparent electrode layer such that the transparent electrode layer remains on only the pixel portion A.

Then, a first passivation layer 240 can be formed on the first substrate 100 on which the transparent electrode 235 is formed. The first passivation layer 240 is formed on the photodiode 205 and on the interlayer dielectric 160 in the peripheral portion B to protect and insulate the photodiode 205 and the line 170. A first trench 243 and a second trench 245 can be formed in the first passivation layer 240. The first trench 243 is selectively formed to expose a portion of the photodiode 205, and the second trench 245 can expose the line 170 in the peripheral portion B.

Referring to FIG. 12, the upper line 255 is formed inside the first trench 243 to electrically connect with the photodiode 205 through the transparent electrode 235. Also, the upper line 255 extends from the first trench 243 to the second trench 245 and so can be electrically connected with the lower line 170. Therefore, a ground voltage can be applied to the photodiode 205 and the lower line 170 through the upper line 255. Also, since the upper line 255 is formed on a portion of the first passivation layer 240 corresponding to the lateral side of the photodiode 205, the upper line 255 can block light incident to the lateral side of the photodiode 205.

Figure 13:
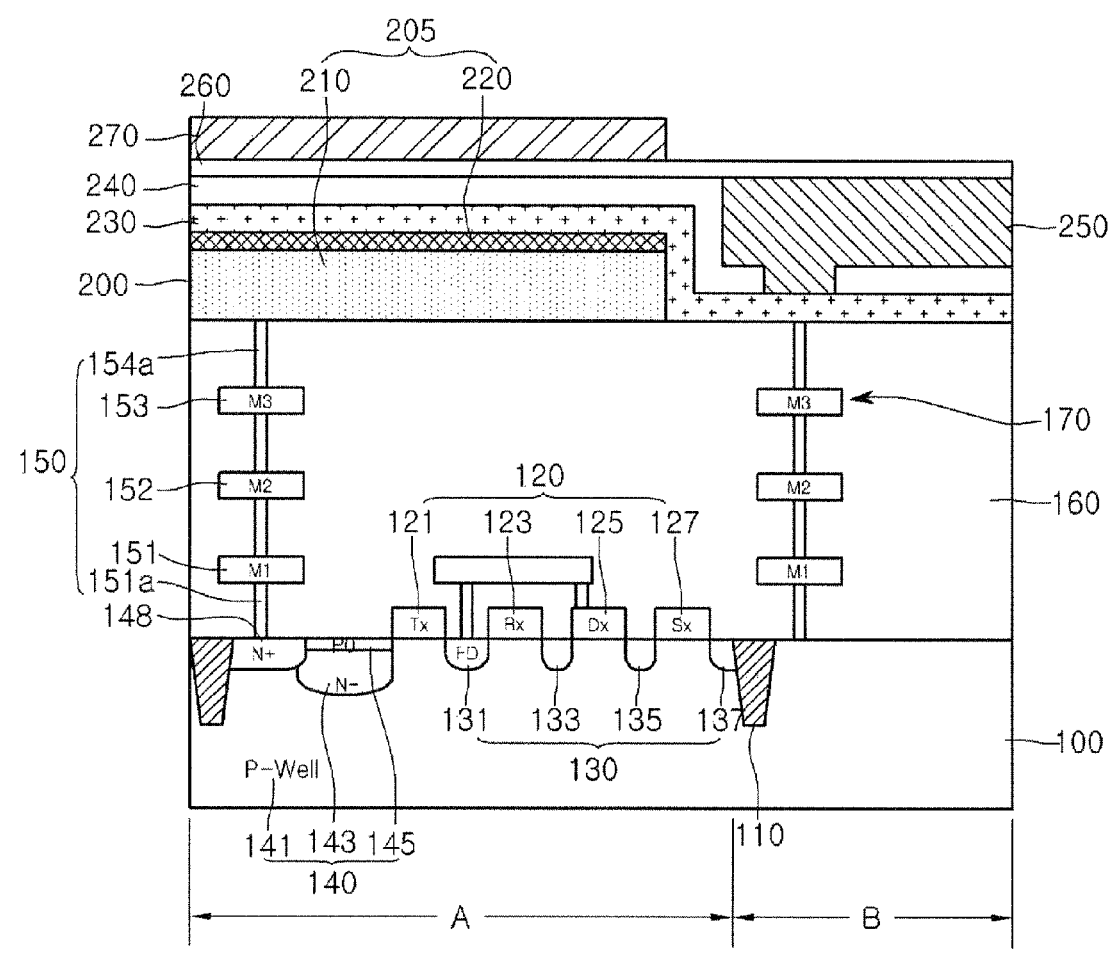
FIG. 13 is a partial detailed view of an image sensor according to another embodiment.

FIG. 13 is a cross-sectional view of an image sensor according to another embodiment.

Referring to FIG. 13, the image sensor includes a first substrate 100 in which a line 150 and a readout circuitry 120 are formed; and a photodiode 205 on the readout circuitry 120. An electrical junction region 140 can be formed in the first substrate 100 and a first conduction type connection region 148 connected with the line 150 can be formed at a side of the electrical junction region 140.

The present embodiment can adopt the technical characteristics of the embodiments described with respect to FIGS. 1-12.

According to the embodiment, a device is designed such that a potential difference is generated between a source and drain at the sides of a transfer transistor Tx, so that a photo charge can be fully dumped. Accordingly, since a photo charge generated from the photodiode is fully dumped to a floating diffusion region 131, the sensitivity of an output image can be increased.

Also, a charge connection region is formed between the photodiode and the readout circuitry to provide a swift movement path of a photo charge, so that a dark current source is minimized, and saturation reduction and sensitivity reduction can be inhibited.

Different from the embodiment described with respect to FIG. 1, the first conduction type connection region 148 is formed at a side of the electrical junction region 140.

According to this embodiment, an N+ connection region 148 for ohmic contact can be formed at a side of the P0/N−/P− junction 140. At this point, a process of forming the N+ connection region 148 and an M1C contact 151a may provide a leakage source because the device operates with a reverse bias applied to the P0/N−/P− junction 140 and so an electric field EF can be generated on the Si surface. This occurs because a crystal defect generated during the contact forming process inside the electric field serves as a leakage source.

Also, according to the embodiment, in the case where the N+ connection region 148 is formed on the surface of the P0/N−/P− junction 140, an electric field due to the N+/P0 junction 148/145 is added. This electric field also serves as a leakage source.

Therefore, a first contact plug 151a can be formed on an active region not doped with a P0 layer, but including the N+ connection region 148. Then, the first contact plug 151a is connected with the N-junction 143 through the N+ connection region 148.

Accordingly, in this embodiment, the electric field is not generated on the Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a first substrate comprising a pixel portion and a peripheral portion;
   a readout circuitry on the pixel portion;
   an interlayer dielectric on the first substrate, including on the pixel portion and the peripheral portion;
   a first lower line passing through the interlayer dielectric to electrically connect with the readout circuitry;
   a second lower line passing through the interlayer dielectric to electrically connect with the peripheral portion;
   a photodiode on a portion of the interlayer dielectric corresponding to the pixel portion;
   a transparent electrode on the interlayer dielectric on which the photodiode is formed, the transparent electrode being electrically connected with the photodiode and the second lower line of the peripheral portion;
   a first passivation layer on the transparent electrode, the first passivation layer comprising a trench exposing a portion of the transparent electrode; and
   an upper line on the peripheral portion, including in the trench of the first passivation layer, wherein the upper line shields a side of the photodiode at an edge of the pixel portion.

2. The image sensor according to claim 1, further comprising:
   a second passivation layer on the first passivation layer and the upper line; and
   a color filter on a portion of the second passivation layer corresponding to the photodiode.

3. The image sensor according to claim 1, wherein the readout circuitry comprises an electrical junction region in the first substrate, wherein the electrical junction region comprises:
   a first conduction type ion implantation region in the first substrate; and
   a second conduction type ion implantation region on the first conduction type ion implantation region.

4. The image sensor according to claim 3, further comprising a first conduction type connection region electrically connected with the first lower line on the electrical junction region.

5. The image sensor according to claim 3, further comprising a first conduction type connection region electrically connected with the first lower line at a side of the electrical junction region.

6. The image sensor according to claim 1, wherein the readout circuitry is designed such that there is a potential difference between a source and a drain of a transistor, wherein the source of the transistor is electrically connected to the first lower line.

7. The image sensor according to claim 6, wherein the transistor comprises a transfer transistor, and wherein an ion implantation concentration of the source of the transfer transistor is lower than an ion implantation concentration of a floating diffusion region at the drain of the transfer transistor.

8. The image sensor according to claim 1, wherein the transparent electrode is formed on only the pixel portion, wherein the first passivation layer is provided on the transparent electrode and the peripheral portion, wherein the first passivation layer further comprises a second trench exposing the second lower line wherein the trench exposing a portion of the transparent electrode is provided corresponding to an edge region of the photodiode, and wherein the upper line extends from the first trench to the second trench and is formed on a portion of the first passivation layer corresponding to a lateral side of the photodiode.

9. The image sensor according to claim 1, wherein the trench is provided on the peripheral portion, wherein a top surface of the upper line has a same height as a top surface of the first passivation layer on the pixel portion.

10. A method for manufacturing an image sensor, the method comprising:
   preparing a first substrate where a pixel portion and a peripheral portion are defined;
   forming a readout circuitry on the pixel portion;
   forming an interlayer dielectric on the first substrate including the pixel portion and the peripheral portion;
   forming a first lower line connected with the readout circuitry and a second lower line connected with the peripheral portion, in the interlayer dielectric;
   preparing a second substrate comprising a crystalline semiconductor layer;
   forming a photodiode in the crystalline semiconductor layer;
   bonding the first substrate and the second substrate such that the first lower line of the first substrate is electrically connected with the photodiode;
   separating the second substrate to expose the photodiode on the first substrate;
   removing a portion of the photodiode corresponding to the peripheral portion, such that the photodiode remains only on the pixel portion, to expose the second lower line on the peripheral portion;
   forming a transparent electrode layer on the first substrate on which the photodiode is provided;
   forming a first passivation layer on the transparent electrode layer;
   forming a first trench in a portion of the first passivation layer to expose a portion of the transparent electrode layer; and
   forming an upper line on the peripheral portion including in the first trench.

11. The method according to claim 10, wherein the transparent electrode layer is connected with the photodiode and the second lower line; wherein the first trench exposes the portion of the transparent electrode layer corresponding to a region on the peripheral portion; wherein the forming of the upper line comprises:
   forming a metal layer on the first passivation layer comprising the trench; and
   planarizing the metal layer such that the metal layer has the same height as a top surface of the first passivation layer of the pixel portion.

12. The method according to claim 10, wherein forming the transparent electrode layer comprises:
   depositing transparent electrode material on the first substrate; and
   removing a portion of the transparent electrode material corresponding to the peripheral portion, the method further comprising:
   forming a second trench in the first passivation layer, wherein the second trench exposes a top surface of the second lower line, wherein the first trench is formed to expose the portion of the transparent electrode layer at an edge of the pixel portion.

13. The method according to claim 12, wherein forming the upper line on the peripheral portion including in the first trench comprises:
   forming the upper line in the first trench and the second trench such that the upper line extends from the first trench to the second trench including on a portion of the first passivation layer corresponding to a lateral side of the photodiode.

14. The method according to claim 10, further comprising, after the forming of the upper line:
   forming a second passivation layer on the first passivation layer and the upper line; and
   forming a color filter on a portion of the second passivation layer corresponding to the photodiode.

15. The method according to claim 10, wherein the forming of the readout circuitry comprises forming an electrical junction region in the first substrate, wherein the forming of the electrical junction region in the first substrate comprises:
   forming a first conduction type ion implantation region in the first substrate; and
   forming a second conduction type ion implantation region on the first conduction type ion implantation region.

16. The method according to claim 15, further comprising forming a first conduction type connection region connected with the first line on the electrical junction region.

17. The method according to claim 16, wherein the forming of the first conduction type connection region is performed after a contact etch for the first lower line.

18. The method according to claim 15, further comprising forming a first conduction type connection region connected with the first line at a side of the electrical junction region.

* * * * *